(12) United States Patent
Clough

(10) Patent No.: US 6,294,270 B1
(45) Date of Patent: Sep. 25, 2001

(54) ELECTRONIC CIRCUIT DEVICE COMPRISING AN EPOXY-MODIFIED AROMATIC VINYL-CONJUGATED DIENE BLOCK COPOLYMER

(75) Inventor: Robert Steven Clough, Saint Paul, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

(21) Appl. No.: 09/219,265

(22) Filed: Dec. 23, 1998

(51) Int. Cl.[7] .............................. H01L 29/12; C08L 53/00
(52) U.S. Cl. ........................ 428/620; 523/403; 523/427; 523/436; 523/437; 524/81; 524/155; 524/158; 524/161; 524/163; 524/174; 525/88; 525/95; 525/98; 525/108; 428/626; 428/901
(58) Field of Search ..................... 523/403, 427; 523/436, 437; 524/81, 155, 158, 161, 163, 174; 525/88, 95, 98, 108; 428/620, 626, 901

(56) References Cited

U.S. PATENT DOCUMENTS

| | | | |
|---|---|---|---|
| 4,054,553 | 10/1977 | Olander | 260/477 |
| 4,092,294 | 5/1978 | Gennett, Jr. et al. | 260/47 |
| 4,250,053 | 2/1981 | Smith | 252/426.6 |
| 4,256,828 | 3/1981 | Smith | 430/280 |
| 4,477,649 | 10/1984 | Mobley | 528/212 |
| 4,477,651 | 10/1984 | White et al. | 528/215 |
| 4,517,341 | 5/1985 | White | 525/15.52 |
| 4,684,678 | 8/1987 | Schultz et al. | 523/466 |
| 5,059,701 | 10/1991 | Keipert | 556/13 |
| 5,191,101 | 3/1993 | Palazzotto et al. | 556/47 |
| 5,229,464 | 7/1993 | Erickson et al. | 525/314 |
| 5,252,694 | 10/1993 | Willett et al. | 525/404 |
| 5,478,885 | 12/1995 | Maase et al. | 525/92 |
| 5,554,664 | 9/1996 | Lamanna et al. | 522/25 |
| 5,843,251 | 12/1998 | Tsukagoshi et al. | 156/64 |

FOREIGN PATENT DOCUMENTS

| | | |
|---|---|---|
| 0 387 066 B1 | 9/1990 | (EP) . |
| 0 516 203 A | 12/1992 | (EP) . |
| 0 658 603 A2 | 6/1995 | (EP) . |
| 7026106 | 1/1995 | (JP) . |
| 8245939 | 9/1996 | (JP) . |
| 9029915 | 2/1997 | (JP) . |
| 11100493 | 4/1999 | (JP) . |
| 11148064 | 6/1999 | (JP) . |
| WO 95/16998 | 6/1995 | (WO) . |
| WO 95/28431 | 10/1995 | (WO) . |
| WO 96/33248 | 10/1996 | (WO) . |
| WO 97/30101 | 8/1997 | (WO) . |
| WO 98/08906 | 3/1998 | (WO) . |
| WO 98/22531 | 5/1998 | (WO) . |
| WO 99/09101 | 2/1999 | (WO) . |

*Primary Examiner*—Samuel A. Acquah
(74) *Attorney, Agent, or Firm*—Philip Y. Dahl

(57) ABSTRACT

An electronic circuit device comprises a resin composition including 90 to 100 weight percent of a curable epoxy-modified aromatic vinyl-conjugated diene block copolymer, optionally up to 10 weight percent of an epoxy resin, and an effective amount of an epoxy curative, the weight percent of the copolymer and epoxy resin being based on the weight of the epoxy bearing material exclusive of curative. The resin composition can be used as an electronic adhesive, covercoat, or encapsulant. The electronic circuit device exhibits superior heat and moisture insensitivity, including the absence of voiding and delamination of the cured resin compostion from its substrate under conditions of 85° C. and 85% relative humidity for 168 hours followed by a temperature of 220° C. for 10 to 40 seconds.

44 Claims, 1 Drawing Sheet

ELECTRONIC CIRCUIT DEVICE COMPRISING AN EPOXY-MODIFIED AROMATIC VINYL-CONJUGATED DIENE BLOCK COPOLYMER

FIELD OF THE INVENTION

This invention relates to an electronic circuit device comprising an epoxy-modified aromatic vinyl-conjugated diene block copolymer. The copolymer can be included in a resin composition that can be used as, for example, an adhesive, a protective covercoat, or an encapsulant.

BACKGROUND OF THE INVENTION

A major trend in the electronics industry is to make products smaller, lighter and faster while maintaining or improving their functionality. One of the key technologies that is enabling the creation of more and more compact products is electronic packaging and assembly technology. Electronic packaging and assembly constitutes the materials and processes required to interconnect a semiconductor chip (IC chip) to other electronic or electrical components. Besides the semiconductor chip, various materials can be incorporated into an electronic package, such as flexible circuitry (metal circuitry on polyimide or other polymer films), metal stiffeners, electrically conductive layers, electrically insulating layers, and heat sinks. Often adhesives are used to adhere these various substrates together and to adhere together multiple layers of circuitry on substrates to form multilayered electronic structures having increased wiring density such as may be required for mulitchip modules. Covercoats and encapsulants are needed to protect the circuitry from harsh environments that may be seen in the products' application. Electrical connection of these packages to printed circuit boards or other electronic components requires that the package undergoes solder reflow, which can expose the package to temperatures of 220° C. for tens of seconds to minutes. This process has proved to be quite demanding on adhesives and cover coats, causing product failures such as voiding and/or delaminating from the various substrates. "Popcorning" is the generic term coined for these failures. The presence of moisture in the package followed by rapid heating to solder reflow temperatures promotes "popcorning". Moisture is sorbed by many organic substrates such as polyimide films and organic adhesives, and it can sorb to metals and inorganic components.

Joint Industry Standard, "Moisture/Reflow Sensitivity Classification for Plastic Integrated Circuit Surface Mount Devices", October 1996, J-STD-020, developed by the Electronic Industries Association's Joint Electron Device Engineering Council (JEDEC) and the Institute of Interconnecting and Packaging Electronic Circuits, is the electronics industry standard for testing the solder resistance of packages after exposure to humidity. This standard grades materials by levels and JEDEC level 1 (85° C./85% R.H. for 168 hours followed by solder reflow at a peak temperature of 220° C. for 10 to 40 seconds) is the most demanding test. Packages that pass JEDEC level 1 have the highest degree of solder resistance, and need not be packaged so as to protect them from ambient moisture. Failure at level 1, but passage at less-demanding levels, requires protective packaging.

The current state of the art in adhesive development allows the achievement of JEDEC level 3 (30° C./60% R.H. for 192 hours followed by solder reflow at a peak temperature of 220° C.) and a very limited number of adhesives claim successful performance of JEDEC level 2 (85° C./60% R.H. for 168 hours followed by solder reflow at a peak temperature of 220° C.). Specific polyimides can pass JEDEC level 1, but these materials require extremely high lamination temperatures of approximately 350° C. Such lamination temperatures prohibit polyimide use in packages that contain materials that will decompose or be altered at these high temperatures, such as organic covercoats, solder masks, solder, etc. In cases where all materials present in the package at the time of lamination can withstand the high laminating temperatures, polyimides can be employed. However, these high temperatures make for a difficult and expensive process.

Epoxidized styrene-diene block copolymers, such as epoxidized styrene-butadiene or epoxidized styrene-isoprene block copolymers, have been described in U.S. Pat. No. 5,478,885. In some applications, the epoxidized block copolymers have been used as rubber toughening agents for commonly-used epoxy resins. Typically, the toughening agent constitutes a small percentage of the total composition.

Cured compositions comprising epoxy resins and epoxy-modified aromatic vinyl-conjugated diene block copolymers have been described in EP658603. The compositions can contain from 5 to 95 parts by weight of an epoxy resin, preferably from 20 to 80 parts by weight. When the composition contains less than S parts by weight of either component, a loss of mechanical properties is reported. Use of these materials in electronic packaging applications is not suggested.

Crosslinking epoxidized styrene-diene block copolymers through the backbone epoxy groups has been shown to produce adhesive compositions for use in, for example, pressure-sensitive adhesive tapes, labels, sealants, and coatings as disclosed in U.S. Pat. No. 5,229,464 and WO 97/30101. The adhesives can be formulated to include reactive diluents, including epoxy resins, in the amount of from 1 to 50% by weight of the total composition. Use of these materials in electronic packaging applications is not suggested.

Compositions comprising cured epoxidized styrene-diene block copolymers useful as multilayered molding materials have been described in WO 98/22531. The compositions can be cured by a wide variety of known epoxy curing agents. Compositions further comprising added polyfunctional co-reactants, in amounts ranging from 0.01 to 25 parts by weight, are also described. Epoxy resins are not disclosed as co-reactants. Use of these materials in electronic packaging applications is not suggested.

Adhesives useful in electronic packaging comprising liquid epoxy resins and an added functionalized resin have been described in EP 387066 (see also U.S. Pat. No. 5,843,251). In order to extend the shelf life of the adhesives, a micro-capsule type curing agent is required in the formulation. Functionalized styrene-diene block copolymers are among the functionalized resins named and not exemplified, wherein the functional group can be an epoxy group. The added functionalized resin can be present in the amount of from 20 to 80% by weight. The adhesives can be processed into adhesive tapes that can be used to electrically connect circuits on chips and wiring substrates. Performance of the adhesives under conditions of JEDEC Level 1 is not described.

Amine crosslinkable hot-melt adhesives useful in electronics applications, comprising a polyolefin having an epoxy group in its molecule, have been described, for example, in WO 96/33248, wherein an aromatic amine curative is required and the composition optionally comprises an epoxy resin. Polyolefins mentioned are copolymers of ethylene and a glycidyl (meth)acrylate group-containing monomer, so that the epoxy groups are pendant from the polymer backbone. Epoxy-modified aromatic vinyl-conjugated diene block copolymers are not suggested. When present, the amount of added epoxy resin is from about 5 to about 200 parts by weight per 100 parts of the polyolefin copolymer. The adhesives were used for electronic systems, but their use under conditions of JEDEC Level 1 is not suggested.

SUMMARY OF THE INVENTION

Briefly, this invention provides an electronic circuit device comprising a resin composition including curable epoxy-modified aromatic vinyl-conjugated diene block copolymer present in the range of 90 to 100 weight percent of the weight of the epoxy bearing material exclusive of curative, optionally up to 10 weight percent of an epoxy resin based on the weight of epoxy-bearing material, and an effective amount of an epoxy curative.

Upon curing with one or both of heat (i.e., temperature up to about 250° C.) and UV radiation, the copolymer resin composition and adjacent substrate(s) exhibit superior solder or heat resistance and moisture insensitivity. In particular, the cured resin composition is stable (i.e., does not void or delaminate from the substrate(s)) after exposure to conditions of 85° C. and 85% relative humidity (R.H.) for 168 hours followed by rapid heating to a temperature of 220° C. for 10 to 40 seconds.

In another aspect, this invention provides a method of using a curable resin composition in an article comprising the steps of:
  providing a curable resin composition on at least one surface of a substrate, said resin composition including in the range of 90 to 100 weight percent of an epoxy-modified aromatic vinyl-conjugated diene block copolymer, optionally up to 10 weight percent of an epoxy resin, the weight of both components based on the weight of epoxy-bearing materials, and an effective amount of an epoxy curative, and
  incorporating said resin composition as an adhesive, covercoat, or encapsulant in an article, which preferably can be an electronic circuit device.

The resin composition can be a layer or it can be in bulk form.

Upon curing the copolymer with one or both of heat and UV radiation the cured copolymer resin composition exhibits superior solder resistance and moisture insensitivity, as defined above.

The cured copolymer resin composition can be an adhesive, an encapsulant, or it can be a protective covercoat for an electronic circuit device. Examples of the use of the adhesive in electronic circuit devices include: adherence of a layer of flexible circuitry to another layer of flexible circuitry or to a metal stiffener or to a semiconductor chip; adherence of copper or other metallic foil to a polymer substrate; and adherence of an electronic component such as a semiconductor chip to a circuit on a substrate. The adhesive may be insulating or it can be made electroconductive by the addition of electroconductive particles.

In this application:
  "electronic circuit" means the path of an electric current or electrons and can include such elements as electric conductors, e.g., metallic wires or metallic traces, and electronic components such as semiconductor chips, transistors, diodes, capacitors, resistors, inductors, etc.;
  "electronic circuit device" means a device comprising an electronic circuit or electronic component, such as (1) an electronic package such as a ball grid array (BGA), a laminated microinterconnect (LMI), multi-chip module, or a chip scale package (CSP), (2) simple flexible circuitry wherein copper foil is adhered to a polymer substrate with an adhesive, or (3) an electronic component such as a semiconductor chip connected to a circuit on a substrate;
  "epoxy-bearing material" means an epoxy-modified aromatic vinyl-conjugated diene plus epoxy resin, if present;
  "solder resistance" means resistance to heat at the temperature of solder reflow;
  "resin composition" means an epoxy-bearing material plus a curative or catalyst; and
  "epoxy-modified aromatic vinyl-conjugated diene block copolymer" includes such copolymers that are partially hydrogenated prior to or subsequent to epoxy-modification.

The present invention is advantageous because the copolymer resin composition provides superior solder resistance and moisture insensitivity and uses lamination temperatures (for example, 220° C.) much lower than those needed for conventional polyimide-based materials (for example, 350° C.). Furthermore, the copolymer resin composition has excellent peel strength (50 to 325 Newtons/dm) to Kapton™ polyimide film (DuPont), and provides over 1000 hours of performance at 85° C./85 R.H. with a 5 volt bias on an interdigitated copper test circuit that has been laminated with the copolymer. The copolymer resin composition has also shown no ink-jet ink sorption by visual observation after immersion for 11 days at room temperature. The copolymer resin composition also has excellent resistance to corrosive, aqueous acidic and/or alkaline environments. Additionally, conventional adhesives and covercoats in electronic packages are known to exhibit moisture-induced failure under solder reflow conditions. The present invention copolymer resin composition does not exhibit moisture-induced failure under solder reflow conditions.

DETAILED DESCRIPTION OF THE PREFERRED EMBODIMENTS

Figure 1:
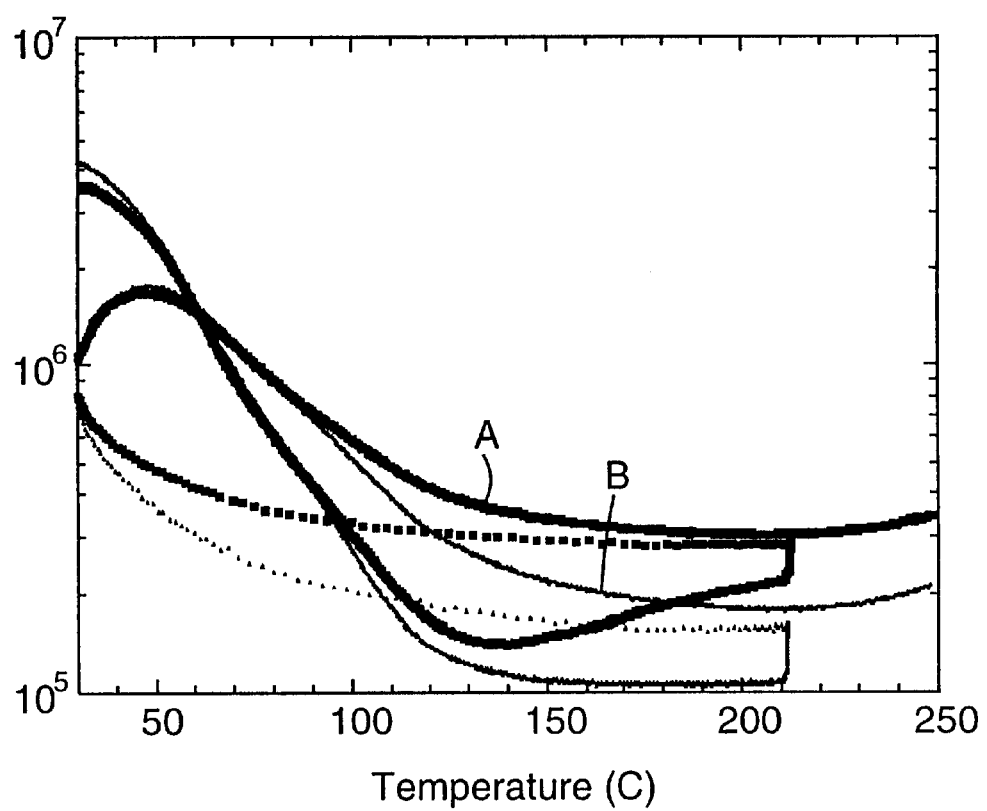
FIG. 1 shows a plot of shear modulus vs. temperature for a preferred composition of the invention.

The adhesive, encapsulant or covercoat copolymer resin composition of the electronic circuit device of the present invention comprises in the range of 90 to 100 weight percent epoxy-modified aromatic vinyl-conjugated diene block copolymer, wherein the block copolymer also may be hydrogenated, in the range of 10 to 0 weight percent epoxy resin based on the weight of epoxy-bearing material in the resin composition, and an epoxy catalyst or curative in an amount in the range of 0.01 to 5.00 weight percent, based on the total weight of the epoxy-bearing material.

The epoxy-modified aromatic vinyl-conjugated diene block copolymer preferably has an epoxy equivalent weight in the range of 100 to 2500, more preferably 100 to 2000, and most preferably 200 to 1000.

The epoxy-modified aromatic vinyl-conjugated diene block copolymer, which preferably is an epoxidized styrene-diene block copolymer, comprises (i) a polymer block derived from polymerization of an aromatic vinyl moiety and (ii) a polymer block derived from polymerization of at least one monomer having conjugated double bonds, wherein the polymer backbone double bonds are at least partially epoxidized, as essential moieties of the chemical structure. The block copolymer preferably is free of pendent epoxy groups.

In the epoxy-modified aromatic vinyl-conjugated diene block copolymer, the aromatic vinyl polymer block can be derived from polymerization of compounds such as, for example, styrene, alpha-methylstyrene, vinyl toluene, p-tert-butylstyrene, divinylbenzene, p-methylstyrene, 4n-propylstyrene, 2,4-dimethylstyrene, 3,5-diethylstyrene, 1,1-diphenyl-styrene, 2,4,6-trimethyl styrene, 4-cyclohexylstyrene, 3-methyl-5-n-hexyl styrene, and the like.

Although one or more of aromatic vinyl compounds may be used, styrene is frequently and preferably used.

In the epoxy modified aromatic vinyl-conjugated diene block copolymer, the double bonds in the backbone can be derived from polymerization of compounds having conjugated double bonds such as, for example, butadiene, isoprene, 1,3-pentadiene, 2,3-dimethyl-1,3-butadiene, piperylene, 3-butyl-1,3-octadiene, 1-phenyl-1,3-butadiene, 1,3-octadiene, 4-ethyl-1,3-hexadiene, and the like.

Although one or more compounds having a conjugated double bond may be used, butadiene, isoprene, piperylene and mixtures thereof are frequently and preferably used.

The block copolymer in the present invention essentially includes a polymer block A derived from one or more aromatic vinyl compounds and a polymer block B derived from one or more compounds having a conjugated double bond.

The copolymerization weight ratio of the aromatic vinyl compound with respect to the compound having a conjugated double bond is generally 5/95 to 70/30, preferably 10/90 to 60/40.

The number average molecular weight of the block copolymer useful in the present invention is generally from 5,000 to 600,000, preferably 10,000 to 500,000, and the molecular weight distribution (the ratio (Mw/Mn) of a weight average molecular weight (Mw) to a number average molecular weight (Mn)) is less than 10.

The molecular structure of the block copolymer useful in the present invention may be any of linear, branched and radial types and any combination thereof.

The epoxidized styrene-diene block copolymer can be represented by general configurations, for example, of $(A-B)_xA$, $(B-A)_x$ and $(A-B)_4Si$, and the like, wherein A and B are as defined above and x is the number of A-B groups in the polymer.

Of them, the $(A-B)_xA$ type copolymer is generally employed.

Unsaturated bonds remaining in the block copolymer may be partially or fully hydrogenated. Alternatively, partial hydrogenation can precede epoxidation.

Preferred epoxidized copolymers include epoxidized non-hydrogenated styrene-butadiene block copolymer (e.g., Epofriend™ A1020, A1010, and A1005, Daicel Chemical Industries LTD, Osaka, Japan). It is anticipated that epoxidized hydrogenated styrene-butadiene block copolymer will be useful in the present invention because of enhanced oxidative stability.

Another preferred epoxidized styrene-diene copolymer that can be used in the adhesive, covercoat, or encapsulant of the invention includes epoxidized styrene-isoprene block copolymer.

Epoxy resins that can be blended and subsequently reacted with the epoxy-modified aromatic vinyl-conjugated diene block copolymer include up to 10 weight percent, preferably 0 to 5 weight percent, more preferably 0 to 3 weight percent, of an aliphatic or aromatic epoxy resin based on the total weight of the epoxy-bearing materials.

Epoxy resins useful in the adhesive, encapsulant or covercoat resin compositions of the invention preferably comprise compounds which contain one or more 1,2-, 1,3- and 1,4-cyclic ethers, which also may be known as 1,2-, 1,3- and 1,4-epoxides. The 1,2-cyclic ethers are preferred. Such compounds can be saturated or unsaturated aliphatic, alicyclic, aromatic or heterocyclic, or can comprise combinations thereof. Compounds that contain more than one epoxy group (i.e., polyepoxides) are preferred.

Aromatic polyepoxides (i.e., compounds containing at least one aromatic ring structure, e.g., a benzene ring, and more than one epoxy group) that can be used in the present invention include the polyglycidyl ethers of polyhydric phenols, such as Bisphenol A-type resins and their derivatives, epoxy cresol-novolac resins, Bisphenol-F resins and their derivatives, and epoxy phenol-novolac resins; and glycidyl esters of aromatic carboxylic acids, e.g., phthalic acid diglycidyl ester, isophthalic acid diglycidyl ester, trimellitic anhydride triglycidyl ester, and pyromellitic acid tetraglycidyl ester, and mixtures thereof. Preferred aromatic polyepoxides are the polyglycidyl ethers of polyhydric phenols, such as the EPON™ series of diglycidyl ethers of Bisphenol-A, including EPON 828 and EPON 1001F, available commercially from Shell Chemicals, Inc., Houston, Tex. Also preferred are aromatic polyepoxides having lower levels of hydrolyzable chloride, such as EPON 828 LS, EPON 1462 (Shell Chemicals, Inc.) and DER™ 332 (Dow Chemical Co., Midland, Mich.).

Representative aliphatic cyclic polyepoxides (i.e., cyclic compounds containing one or more saturated carbocyclic rings and more than one epoxy group, also known as alicyclic compounds) useful in the present invention include the ERL™ series of alicyclic epoxides commercially available from Union Carbide Corp., Danbury, Conn., such as vinyl cyclohexene dioxide (ERL-4206), 3,4-epoxycyclohexylmethyl-3,4-epoxycyclohexane carboxylate (ERL-4221), 3,4-epoxy-6-methylcyclohexylmethyl-3,4-epoxy-6-methylcyclohexane carboxylate (ERL-4201), bis (3,4-epoxy-6-methylcycylohexylmethyl)adipate (ERL-4289), dipentene dioxide (ERL-4269), as well as 2-(3,4-epoxycyclohexyl)5,1"-spiro-3",4"-epoxycyclohexane-1,3-dioxane, 4-(1,2-epoxyethyl)-1,2-epoxycyclohexane and 2,2-bis(3,4-epoxycyclohexyl)propane. Preferred alicyclic polyepoxides are the ERL™ series.

Representative aliphatic polyepoxides (i.e., compounds containing no carbocyclic rings and more than one epoxy group) include 1,4-bis(2,3-epoxypropoxy)butane, polyglycidyl ethers of aliphatic polyols such as glycerol, polypropylene glycol, 1,4-butanediol, and the like, and the diglycidyl ester of linoleic dimer acid. Also useful are epoxidized vegetable oils such as epoxidized linseed and soybean oils available as and Vikoflex™ resins, monoepoxides such as epoxidized alpha-olefins available as Vikolox™ resins, both of which are available from Elf Atochem North America, Inc., Philadelphia, Pa., and epoxidized Kraton™ liquid polymers, such as L-207™ available from Shell Chemical Co., Houston, Tex.

Additional polyepoxides useful in the present invention include liquid, epoxidized conjugated dienes, such as Poly bd™ 600 and Poly bd 605, commercially available from Elf Atochem North America, Inc.

A wide variety of commercial epoxy resins are available and are listed or described in, e.g., the *Handbook of Epoxy Resins*, by Lee and Neville, McGraw-Hill Book Co., New York (1967), *Epoxy Resins, Chemistry and Technology*, Second Edition, C. May, ed., Marcell Decker, Inc., New York (1988), and *Epoxy Resin Technology*, P. F. Bruins, ed., Interscience Publishers, New York, (1968). Any of the epoxy resins described therein may be useful in preparation of the materials of the present invention.

Suitable curatives or catalysts desirably tolerate melt or solution processing steps according to the present invention without substantially curing the epoxy component, while retaining the ability to cure the epoxy component at a later time under the influence of heat or light. For example, the epoxy should remain substantially uncured during and after exposure to the temperature present in a melt processing step. Other factors that influence catalyst selection include the thickness of the film to be cured, transparency of the film to curing radiation, and the film's end use. Subject to these limitations, suitable curatives may be selected from any known epoxy curatives or catalysts.

Curatives of the present invention can be photocatalysts, thermal catalysts, or thermal curing agents.

Known photocatalysts include two general types: onium salts and cationic organometallic salts, which are both useful in the invention.

Onium salt photocatalysts for cationic polymerizations of the invention include iodonium and sulfonium complex salts. Useful aromatic iodonium complex salts are of the general formula:

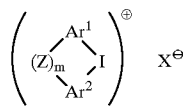

wherein $Ar^1$ and $Ar^2$ can be the same or different and are aromatic groups having from 4 to about 20 carbon atoms, and are selected from the group consisting of phenyl, thienyl, furanyl, and pyrazolyl groups;

Z is selected from the group consisting of oxygen, sulfur, a carbon—carbon bond,

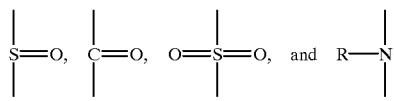

wherein R can be aryl (having from 6 to about 20 carbon atoms, such as phenyl) or acyl (having from 2 to about 20 carbon atoms, such as acetyl, or benzoyl), and

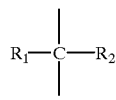

wherein $R_1$ and $R_2$ are selected from the group consisting of hydrogen, alkyl radicals having from 1 to about 4 carbon atoms, and alkenyl radicals having from 2 to about 4 carbon atoms;

m is zero or 1; and

X may have the formula $DQ_n$, wherein D is a metal from Groups IB to VIII or a metalloid from Groups IIIA to VA of the Periodic Chart of the Elements (Chemical Abstracts version), Q is a halogen atom, and n is an integer having a value of from 1 to 6. Preferably, the metals are copper, zinc, titanium, vanadium, chromium, magnesium, manganese, iron, cobalt, or nickel and the metalloids preferably are boron, aluminum, antimony, tin, arsenic and phosphorous. Preferably, the halogen, Q, is chlorine or fluorine. Illustrative of suitable anions are $BF_4^-$, $B(C_6F_5)_4^-$, $PF_6^-$, $SbF_6^-$, $FeCl_4^-$, $SnCl_5^-$, $AsF_6^-$, $SbF_5OH^-$, $SbCl_6^-$, $SbF_5^{-2}$, $AlF_5^{-2}$, $GaCl_4^-$, $InF_4^-$, $TiF_6^{-2}$, $ZrF_6^-$, $CF_3SO_3^-$, and the like. Preferably, the anions are $BF_4^-$, $B(C_6F_5)_4^-$, $PF_6^-$, $SbF_6^-$, $AsF_6^-$, $SbF_5OH^-$, and $SbCl_6^-$. More preferably, the anions are $B(C_6F_5)_4^-$, $SbF_6^-$, $AsF_6^-$, $PF_6^-$ and $SbF_5OH^-$.

Additional anions useful as the anionic portion of the catalysts and initiators of the present invention have been described in U.S. Pat. No. 5,554,664, which is incorporated herein by reference. The anions may be generally classified as fluorinated (including highly fluorinated and perfluorinated) tris alkyl- or arylsulfonyl methides and corresponding bis alkyl- or arylsulfonyl imides, as represented by Formulas I and II, respectively, and hereinafter referred to as "methide" and "imide" anions, respectively, for brevity, $$(R_fSO_2)_3C^- \qquad (I)$$

$$(R_fSO_2)_2N^- \qquad (II)$$

wherein each $R_f$ is independently selected from the group consisting of highly fluorinated or perfluorinated alkyl or fluorinated aryl radicals. The methides and imides may also be cyclic, when a combination of any two $R_f$ groups are linked to form a bridge.

The $R_f$ alkyl chains may contain from 1–20 carbon atoms, with 1–12 carbon atoms preferred. The $R_f$ alkyl chains may be straight, branched, or cyclic and preferably are straight. Heteroatoms or radicals such as divalent oxygen, trivalent nitrogen or hexavalent sulfur may interrupt the skeletal chain, as is well recognized in the art. When $R_f$ is or contains a cyclic structure, such structure preferably has 5 or 6 ring members, 1 or 2 of which can be heteroatoms. The alkyl radical $R_f$ is also free of ethylenic or other carbon—carbon unsaturation: e.g., it is a saturated aliphatic, cycloaliphatic or heterocyclic radical. By "highly fluorinated" is meant that the degree of fluorination on the chain is sufficient to provide the chain with properties similar to those of a perfluorinated chain. More particularly, a highly fluorinated alkyl group will have more than half the total number of hydrogen atoms on the chain replaced with fluorine atoms. Although hydrogen atoms may remain on the chain, it is preferred that all hydrogen atoms be replaced with fluorine to form a perfluoroalkyl group, and that any remaining hydrogen atoms beyond the at least half replaced with fluorine be replaced with bromine and or chlorine. It is more preferred that at least two out of three hydrogens on the alkyl group be replaced with fluorine, still more preferred that at least three of four hydrogen atoms be replaced with fluorine and most preferred that all hydrogen atoms be replaced with fluorine to form a perfluorinated alkyl group.

The fluorinated aryl radicals of Formulas I and II may contain from 6 to 22 ring carbon atoms, preferably 6 ring carbon atoms, where at least one, and preferably at least two, ring carbon atoms of each aryl radical is substituted with a fluorine atom or a highly fluorinated or perfluorinated alkyl radical as defined above, e.g., $CF_3$.

Examples of anions useful in the practice of the present invention include: $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(C_4F_9SO_2)_3C^-$, $(CF_3SO_2)_2(C_4F_9SO_2)C^-$, $(CF_3SO_2)(C_4F_9SO_2)N^-$, $[(CF_3)_2NC_2F_4SO_2]_2N^-$, $(CF_3)_2NC_2F_4SO_2C^-(SO_2CF_3)_2$, $(3,5$-bis$(CF_3)C_6H_3)SO_2N^-SO_2CF_3$,

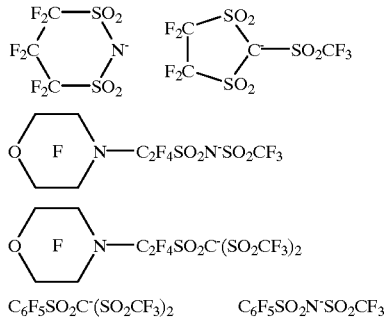

$C_6F_5SO_2C^-(SO_2CF_3)_2$    $C_6F_5SO_2N^-SO_2CF_3$ and the like. More preferred anions are those described by Formula I wherein $R_f$ is a perfluoroalkyl radical having 1–4 carbon atoms.

The $Ar_1$ and $Ar_2$ aromatic groups may optionally comprise one or more fused benzo rings (e.g., naphthyl, benzothienyl, dibenzothienyl, benzofuranyl, dibenzofuranyl, etc.). The aromatic groups may also be substituted, if desired, by one or more non-basic groups if they are essentially non-reactive with epoxide and hydroxyl functionalities.

Useful aromatic iodonium complex salts are described more fully in U.S. Pat. No. 4,256,828, which is incorporated herein by reference.

The aromatic iodonium complex salts useful in the invention are photosensitive only in the ultraviolet region of the spectrum. However, they can be sensitized to the near ultraviolet and the visible range of the spectrum by sensitizers for known photolyzable organic halogen compounds. Illustrative sensitizers include aromatic amines and colored aromatic polycyclic hydrocarbons, as described in U.S. Pat. No. 4,250,053, incorporated herein by reference.

Aromatic sulfonium complex salt catalysts suitable for use in the invention are of the general formula

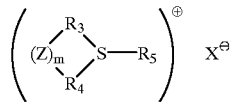

wherein $R_3$, $R_4$ and $R_5$ can be the same or different, provided that at least one of the groups is aromatic. These groups can be selected from the group consisting of aromatic moieties having from 4 to about 20 carbon atoms (e.g., substituted and unsubstituted phenyl, thienyl, and furanyl) and alkyl radicals having from 1 to about 20 carbon atoms. The term "alkyl" includes substituted alkyl radicals (e.g., substituents such as halogen, hydroxy, alkoxy, and aryl). Preferably, $R_3$, $R_4$ and $R_5$ are each aromatic; and Z, m and X are all as defined above with regard to the iodonium complex salts.

If $R_3$, $R_4$ or $R_5$ is an aromatic group, it may optionally have one or more fused benzo rings (e.g., naphthyl, benzothienyl, dibenzothienyl, benzofuranyl, dibenzofuranyl, etc.). The aromatic groups may also be substituted, if desired, by one or more non-basic groups if they are essentially non-reactive with epoxide and hydroxyl functionalities.

Triaryl-substituted salts such as triphenylsulfonium hexafluoroantimonate and p-(phenyl(thiophenyl)) diphenylsulfonium hexafluoroantimonate are preferred sulfonium salts as described in U.S. Pat. No. 4,256,828, Example 37, which is incorporated herein by reference. Triphenylsulfonium hexafluoroantimonate ($Ph_3SSbF_6$) is a most preferred catalyst. Useful sulfonium salts are described more fully in U.S. Pat. No. 5,256,828, which is incorporated herein by reference.

Aromatic sulfonium complex salts useful in the invention are photosensitive only in the ultraviolet region of the spectrum. However, they can be sensitized to the near ultraviolet and the visible range of the spectrum by a select group of sensitizers such as described in U.S. Pat. Nos. 4,256,828 and 4,250,053.

Suitable photoactivatable or thermally activatable organometallic complex salts useful in the invention include those described in U.S. Pat. Nos. 5,059,701, 5,191,101, and 5,252,694, each of which is incorporated herein by reference. Such salts of organometallic cations have the general formula:

$$[(L^1)(L^2)M]^{+e}(X^-)_q$$

wherein M represents a metal atom selected from elements of periodic groups IVB, VB, VIB, VIIB and VIII, preferably Cr, Mo, W, Mn, Re, Fe, and Co; $L^1$ represents none, one, or two ligands contributing π-electrons that can be the same or different ligand selected from the group consisting of substituted and unsubstituted acyclic and cyclic unsaturated compounds and groups and substituted and unsubstituted carbocyclic aromatic and heterocyclic aromatic compounds, each capable of contributing two to twelve π-electrons to the valence shell of the metal atom M. Preferably, $L^1$ is selected from the group consisting of substituted and unsubstituted $\eta^3$-allyl, $\eta^5$-cyclopentadienyl, $\eta^7$-cycloheptatrienyl compounds, and $\eta^6$-aromatic compounds selected from the group consisting of $\eta^6$-benzene and substituted $\eta^6$-benzene compounds (e.g., xylenes) and compounds having 2 to 4 fused rings, each capable of contributing 3 to 8 π-electrons to the valence shell of M; $L^2$ represents none or 1 to 3 ligands contributing an even number of σ-electrons that can be the same or different ligand selected from the group consisting of carbon monoxide, nitrosonium, triphenyl phosphine, triphenyl stibine and derivatives of phosphorous, arsenic and antimony, with the proviso that the total electronic charge contributed to M by $L^1$ and $L^2$ results in a net residual positive charge of e to the complex; and e is an integer having a value of 1 or 2, the residual charge of the complex cation; q is an integer having a value of 1 or 2, the number of complex anions X required to neutralize the charge e on the complex cation; X is a halogen-containing complex anion, as described above.

Certain thermally-activated curing agents for epoxy resins (e.g., compounds that effect curing and crosslinking of the epoxide by entering into a chemical reaction therewith) can be useful in the present invention. Preferably, such curing agents are thermally stable at temperatures at which mixing of the components takes place.

Suitable thermal curing agents include aliphatic and aromatic primary and secondary amines, e.g., di(4-aminophenyl)sulfone, di(4-aminophenyl)ether, and fluorene diamines, such as those described in U.S. Pat. No. 4,684,678, incorporated herein by reference, and 2,2-bis-(4- aminophenyl)propane; aliphatic and aromatic tertiary amines, e.g., dimethylaminopropylamine; imidazoles, such as methylimidiazole, and pyridine; quaternary ammonium salts, particularly pyridinium salts such as N-methyl-4-picolinium hexafluorophosphate; sulfoninum salts; boron trifluoride complexes such as $BF_3.Et_2O$ and $BF_3.H_2NC_2H_5OH$; hydrazines, such as adipohydrazine; and guanidines, such as tetramethylguanidine and dicyandiamide (cyanoguanimide, commonly known as DiCy); compounds containing two or more carboxylic acid groups or compounds containing one or more carboxylic acid anhydride groups, and combinations of these latter compounds with accelerators such as imidazoles, as described in U.S. Pat. No. 5,229,464.

Additional thermal epoxy catalysts that can be useful in the present invention include simple pyridinium, quinolinium, indolinium, alkyl, aryl and alkylaryl ammonium, and phosphonium salts. Useful ammonium and phosphonium salts are described in PCT application WO 98/08906.

Preferred curatives useful in the invention include UV photocatalysts such as sulfonium and iodonium salts. Resin compositions containing such photocatalysts can be rapidly partially cured by UV radiation. The partially cured compositions show improved dimensional stability in subsequent thermal lamination steps where heat and pressure are applied to laminate the adhesive to a substrate and further cure the adhesive.

Catalysts useful in the invention can be present in an amount in the range of 0.01 to 5 weight percent, based on total weight of epoxy bearing material, preferably 0.01 to 4 weight percent, and most preferably 0.01 to 3 weight percent. Solid or liquid catalysts may be dissolved or dispersed in the chosen epoxy resin. Heating may be required, but the heating should not be sufficient to cure the epoxy resin. No solvent is necessary for this procedure. The epoxy resin (as defined above)/catalyst mixture may then be pumped into an extruder for a melt processing step. Alternatively, the catalyst could be added directly into the thermoplastic/epoxy mixture during melt blending. In the case of solvent processing, the catalyst can be dissolved with the epoxy-bearing material in an appropriate solvent, or the catalyst can be predissolved in the epoxy resin and then added to the solvent. Useful solvents include methyl ethyl ketone, toluene, ethyl acetate, butyl acetate, and cyclohexane.

In addition, resin compositions of the present invention can include from 0 to up to 80 parts by weight of polyphenylene ether resins (PPE) per 100 parts by weight of the epoxy-modified aromatic vinyl-conjugated diene block copolymer, wherein the total weight of the epoxy-modified aromatic vinyl-conjugated diene block copolymer plus PPE comprises 90 to 100 weight percent of the total composition less the curative. The polyphenylene ethers comprise a plurality of structural units having the formula

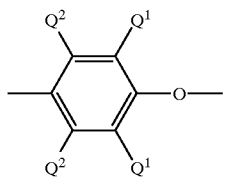

Each $Q^1$ is independently halogen, primary or secondary lower alkyl (i.e., alkyl containing up to 7 carbon atoms), phenyl, haloalkyl, aminoalkyl, hydrocarbonoxy, or halohydrocarbonoxy wherein at least two carbon atoms separate the halogen and oxygen atoms; and each $Q^2$ is independently hydrogen or $Q^1$ as defined above. Examples of suitable primary lower alkyl groups are methyl, ethyl, n-propyl, n-butyl, isobutyl, n-amyl, isoamyl, 2-methylbutyl, n-hexyl, 2,3-dimethylbutyl, 2-,3- or 4-methylpentyl and the corresponding heptyl groups. Examples of secondary lower alkyl groups are isopropyl, sec-butyl and 3-pentyl. Preferably, any alkyl radicals are straight chain rather than branched. Most often, each $Q^1$ is alkyl or phenyl, and especially alkyl having 1 to 4 carbon atoms, and each $Q^2$ is hydrogen.

Both homopolymer and copolymer polyphenylene ethers are useful additives in the process of the present invention. Suitable homopolymers are those containing, for example, 2,6-dimethyl-1,4-phenylene ether units. Suitable copolymers include random copolymers containing such units in combination with, for example, 2,3,6-trimethyl-1,4-phenylene ether units. Many suitable random copolymers, as well as homopolymers, are disclosed in the patent literature. Reference is made to U.S. Pat. Nos. 4,054,553, 4,092,294, 4,477,649, 4,477,651 and 4,517,341, the disclosures of which are incorporated herein by reference.

A preferred PPE, poly(2,6-dimethylphenylene oxide), is available under the trade name Blendex™ HPP820 from General Electric Co., Pitsfield, Mass.

Optionally, resin compositions of the present invention may comprise a tackifier. Any suitable tackifier may be employed in the present invention. The tackifier can be present as 0.1–150 parts by weight of tackifier per 100 parts of the resin composition. Useful tackifiers can include rosin esters, aliphatic and aromatic hydrocarbon resins and mixtures thereof, and terpene resins. Useful rosin esters can include the Hercoflex™, Hercolyn™, and Foral™ families of rosin and hydrogenated rosin tackifiers, commercially available from Hercules Chemical Specialties Co., Wilmington, Del. Useful aliphatic and aromatic hydrocarbon resins can include the Wingtack™ and Wingtack Plus™ families of aliphatic and mixed aliphatic/aromatic resins, commercially available from Goodyear Tire and Rubber Co., Chemical Div., Akron, Ohio; the Escorez™ family of aliphatic, aromatic and mixed aliphatic/aromatic resins, commercially available from Exxon Chemical Co., Houston, Tex.; and the Piccotac™ and Regalrez™ families of aliphatic and aromatic resins, commercially available from Hercules. Useful terpene resin tackfiers can include the Zonarez™ family of terpenes, commercially available from Arizona Chemical Div., International Paper Co., Panama City, Fla., and the Piccolyte™ and Piccofyn™ families of terpenes, commercially available from Hercules. Preferably, tackifiers useful in the invention include Escorez™ mixed aliphatic/aromatic hydrocarbon tackfiers.

In addition, the resin composition may also comprise a polyol. The polyol is preferably reactive with epoxy groups under curing conditions. The polyol preferably modifies cure speed and final adhesive performance, and can be useful as a chain extender in epoxy resin formulations. The polyol may be included in a weight ratio, relative to the epoxy resin, of between 0.1/99.9 to 40/60.

Examples of such polyols include ethylene glycol, 1,2- and 1,3-propane diol, 1,2-,1,3-, 1,4- and 2,3-butane diol, 1,5-pentane diol, 1,6-hexane diol, 1,8-octane diol, neopentyl glycol, 1,4-bishydroxymethyl cyclohexane (1,4-cyclohexane dimethanol), 2-methyl-1,3-propane diol, dibromobutene diol, glycerol, trimethylolpropane, 1,2,6-hexanetriol, 2,2-dimethyl-1,3-propane diol, 1,6- and 2,5-hexane diol, 1,12-dodecane diol, 1,12- and 1,18-octadecane diol, 2,2,4 and 2,4,4-trimethyl-1,6-hexane diol, cyclohexane-1,4-diol, 2,2-bis-(4-hydroxycyclohexyl)- propane, bis-(4-hydroxyphenyl)-methane, bis-(4-hydroxyphenyl)-sulphone, 1,4-bis-(hydroxymethyl)-benzene, 1,4-dihydroxy-benzene, 2,2-bis-(4-hydroxyphenyl)-propane, 1,4-bis(ω-hydroxyethoxy)-benzene, 1,3-bis-hydroxyalkyl hydantoins, tris-hydroxyalkyl isocyanurates and tris-hydroxyalkyl-triazolidane-3,5-diones, trimethylolethane, pentaerythritol, quinitol, mannitol, sorbitol, diethylene glycol, triethylene glycol, tetraethylene glycol, dipropylene glycol, higher polypropylene glycols, higher polyethylene glycols, higher polybutylene glycols, 4,4'-dihydroxy diphenylpropane, dihydroxymethyl hydroquinone, and combinations thereof.

Higher molecular weight polyols include the polyethylene and polypropylene oxide polymers in the molecular weight range of from about 200 to about 20,000, such as the Carbowax™ series of poly(ethylene oxide) compounds (available from Union Carbide Corp., Danbury, Conn.), caprolactone polyols in the molecular weight range of from about 200 to about 5000, such as the Tone™ series of polyols (available from Union Carbide), poly(tetramethylene ether) glycols in the molecular weight range of from about 200 to about 4000, such as the Terethane™ 1000 and 2000 series of polyols (available from DuPont Co., Wilmington, Del.), hydroxy-terminated polybutadiene materials, such as the Poly bd™ series of polyols (available from Elf Atochem, Philadelphia, Pa.), polycarbonate diols, such as the KM™ series, including KM-10-1667™ and KM-10-1733™ (available from Stahl USA, (Peabody, Mass.), poyurethane diols, such as K-flex™ materials, including K-flex UD-320-100™ (available from King Industries, Norwalk, Conn.), aromatic polyether polyols, such as Synfac™ materials, including Synfac 8024™ (available from Milliken Chemical, Spartanburg, S.C.), and random copolymers of poly(tetramethylene oxide)/polycarbonate, such as the PolyTHF™ CD series of polyols (available from BASF Corporation, Mount Olive, N.J.). Preferred polyester polyols include the Desmophen™ family, available from Bayer, Elkart, Ind. A preferred acrylic polyol is Joncryl™ 587, commercially available from S. C. Johnson & Son, Inc., Racine, Wis.

Another group of preferred polyols includes hydroxyalkylated bisphenol derivatives. Preferred polyols in this group have the following general formula:

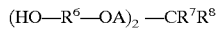

(HO—R$^6$—OA)$_2$ —CR$^7$R$^8$ wherein R$^6$ is either a straight or branched or cyclic alkylene (e.g., methylene, ethylene, butylene, decylene) group consisting of 1 to 10 carbon atoms, or an aralkylene group consisting of 7 to 14 carbon atoms (e.g., benzylidene, 1,2-diphenylethylene, phenethylene); R$^7$ and R$^8$ independently may be an alkyl group, aralkyl group, cycloalkyl group, alkaryl group, or an aryl group of from 1 to about 30 carbon atoms (preferably methyl, ethyl, and trifluoromethyl) and none or from 1 to about 10 heteroatoms, and R$^7$ and R$^8$ together can comprise an alkylene, cycloalkylene, arylene, alkarylene or aralkylene group containing from 2 to about 660 carbon atoms and none or from 1 to about 10 heteroatoms;

A can be a substituted or unsubstituted arylene group, preferably having from 6 to about 12 carbon atoms, most preferably p-phenylene, o-phenylene or dimethylnaphthalene.

Specific preferred hydroxyalkylated bisphenols include 9,9-bis-4-(2-hydroxyethoxyphenyl)fluorene (i.e., hydroxyethylated bisphenol of fluorenone), 2,2-bis-4-(2-hydroxyethoxyphenyl)butane (i.e., hydroxyethylated bisphenol of 2-butanone), 2,2-bis-4-(2-hydroxyethyoxphenyl)hexafluoropropane (i.e., hydroxyethylated bisphenol F), 1,2-bis-4-(2-hydroxyethyoxphenyl)propane, 2,2-bis-4-(2-hydroxyethoxyphenyl)norbornane, 2,2-bis-4(2-hydroxyethoxyphenyl)-5,6-cyclopentanonorbornane, and 1,1-bis-4-(2-hydroxyethoxyphenyl)cyclohexane.

Other polyols suitable for use in the production of epoxy resins useful in the invention include the hydroxyalkyl ethers obtained by the addition of optionally substituted alkylene oxides, such as ethylene oxide, propylene oxide, butylene oxide and styrene oxide, onto the above-mentioned polyols.

Optional components of the present invention are stabilizers that inhibit or retard heat degradation, oxidation, skin formation and color formation. Stabilizers are typically added to formulations of the invention in order to protect the polymers against heat degradation and oxidation during preparation, use and high temperature storage of the compositions. Additional stabilizers known in the art may also be incorporated into the composition to protect against, for example, oxygen, ozone, and ultraviolet radiation. However, these additional stabilizers should be compatible with the primary stabilizers noted above.

In addition, the resin composition may comprise from 0 up to 99 parts by weight of an aromatic vinyl-conjugated diene block copolymer per 100 parts by weight of epoxy-modified aromatic vinyl-conjugated diene block copolymer. Styrene-butadiene and styrene-isoprene block copolymers, wherein the diene block may be hydrogenated, are preferred members of this group.

Various adjuvants can also be added to the compositions of the invention to alter the physical characteristics of the final material. Included among useful adjuvants are thixotropic agents such as fumed silica; pigments to enhance color tones such as ferric oxide, carbon black and titanium dioxide; fillers such as mica, silica, acicular wollastonite, calcium carbonate, magnesium sulfate and calcium sulfate; electrically and/or thermally conductive fillers, including metal particles, graphite, and metal-coated microspheres; chopped fibers and whiskers, including glass and carbon; clays such as bentonite; glass beads and bubbles; reinforcing materials such as unidirectional woven and nonwoven webs of organic and inorganic fibers such as polyester, polyimide, glass fibers, polyamides such as poly(p-phenylene terephthalamide), carbon fibers, and ceramic fibers. Amounts up to about 200 parts of adjuvant per 100 parts of resin composition can be used.

Epoxy-modified aromatic vinyl-conjugated diene block copolymer can be prepared by at least partial epoxidation of unsaturated bonds in the polymer block derived from polymerization of a compound having a conjugated double bond as is known in the art and described, for example, in EP 0658603A2.

The materials of the present invention can be prepared by batch or continuous processing. Either can involve melt or solution processing.

Batch melt processing can be accomplished by adding thermoplastic epoxy-modified aromatic-vinyl conjugated diene block-copolymer, typically in pellet form, to a preheated mixer, such as a Brabender mixer (C. W. Brabender Instruments, Inc., South Hackensack, N.J.) equipped with, e.g., cam or sigma blades. After stirring for about 5 minutes, the thermoplastic is melted and a mixture of epoxy resin and curative for the epoxy is added with continued stirring. The resultant mixture is stirred to ensure complete mixing, at a duration and temperature below that which would substantially cure the epoxy component, and removed from the mixer. The mixture can then be coated, molded, formed, shaped or pressed into a desired final configuration. The shaped object may then be irradiated and/or heated to cure the epoxy resin component. In particular, when a thin sheet or film is desired, the molten mass can be pressed in a heated flat-plate press, such as a Carver laboratory press (F. Carver, Inc., Wabash, Ind.).

Continuous melt processing can be accomplished using an extruder, e.g., a twin-screw extruder, equipped with a downstream port, mixing elements and an appropriate output orifice (film die, sheet die, fiber die, profile die, etc.) and a take-up or casting roll and wind-up roll(s), as appropriate. The casting roll may be cooled or maintained at a set temperature by thermostatic means. Solid thermoplastic is added to the input end of the extruder and processed using a temperature profile that is appropriate for the thermoplastic and which will not substantially cure the epoxy component (s), taking into account the duration of residence of the material in the extruder during processing. Solid epoxy resins and curatives may be added with the thermoplastic to the input end of the extruder or at other points along the extruder prior to the mixing zones. Liquid epoxy resins and curatives which may be dissolved or dispersed in the epoxy resins may be injected via gear or syringe pump through the downstream port into the extruder prior to the mixing elements. Take-up line speed is adjusted as appropriate for the output (sheet, fiber, etc.), typically from about 0.5 m/min to about 200 m/min.

In the cases where thermal curing of the epoxy component (s) is desirable immediately after extrusion, i.e., before the thermoplastic polymer cools and solidifies, further heating of the extrudate can take place directly at the die orifice or at a casting wheel. When it is desired that epoxy cure take place after the thermoplastic polymer cools and solidifies, the heat source(s) can be located just prior to the take-up roll. Finally, when it is desirable that no epoxy curing take place after extrusion such heating devices are absent.

In the case where photocuring of the epoxy component(s) is desirable immediately after extrusion, i.e., before the thermoplastic polymer cools and solidifies, UV irradiation of the heated extrudate can take place directly at the die orifice. Irradiation can be accomplished by any number of commercially-available UV sources, such as one or more Fusion Systems "D" or "H" bulbs (available from Fusion UV Curing Systems, Rockville, Md.) or Sylvania BL 350 bulbs. When it is desired that epoxy cure take place after the thermoplastic polymer cools and solidifies, the light source (s) can be located just prior to the take-up roll. Finally, where it is desirable that no immediate epoxy curing take place after extrusion, the irradiation devices are absent and precautions may be taken to prevent UV exposure.

It is within the scope of the invention that a blended film, obtained from a sheet die, may be drawn either uniaxially or biaxially as it emerges from the die. Cure, as above, may take place before, during or after such drawing.

Solution processing can be accomplished by mixing the epoxy-modified aromatic vinyl conjugated diene block copolymer, epoxy resin, and curative in a solvent. The process can take place in a tank equipped with a mixer and, optionally, a heater. The components can be substantially dissolved in the solvent, giving a clear or slightly hazy or opalescent solution or mixture. The solution can be conveyed to a coater where the solution can be coated onto a substrate that is to be used in the assembly of an electronic circuit device. Alternatively, the solution can be coated onto a carrier or release liner. The coating method can include knife coating, nip coating, kiss coating, curtain coating, gravure coating, as well as other coating methods known in the art. The coated substrate or carrier can then be dried to remove solvent. Epoxy curing can take place in the drying step or thereafter, using methods as described previously for melt processed resins.

Where a film is used as an adhesive or coating, the material in an uncured state may be applied as a sheet to its final substrate and cured in situ by application of heat, pressure, UV light, or combinations thereof in any order. Alternatively, uncured films may be applied to a substrate, then partially cured using UV radiation or heat, followed by application of a second substrate to the partially-cured adhesive, after which the construction is fully cured using UV radiation, heat and/or pressure. In addition, uncured films may also be partially cured using UV radiation or heat prior to application to a substrate, then applied to a substrate and further cure using heat and/or pressure. Adhesive films can be of a thickness in the range of 0.0025 mm to 6.35 mm.

When heat curing is used, the method of heat generation is not restricted. Common methods include combustion of fuels and the conversion of electrical energy into heat. The latter can include resistance heating (including infrared heating), induction heating, electric arc (plasma) heating, and dielectric heating (including microwave heating).

This invention is useful in the production of high performance adhesives and coatings, especially where improved heat resistance and moisture insensitivity is required. For example, this invention is useful in laminating films for electronic applications. The present invention is useful as any of an adhesive, as an encapsulant, as a protective covercoat, or combinations thereof.

Substrates for the copolymer resin composition can be those known in the art including polyimides, metal stiffeners, semiconductor chips, printed circuit boards, glass, ceramics, and metal (preferably copper) foil.

The electronic circuit device comprising the resin composition of the invention is useful in ball grid arrays (BGA), laminated microinterconnects (LMI), chip scale packaging (CSP), chip on board, chip on glass, and flexible circuits where the devices are subject to solder reflow even in the presence of high humidity.

Objects and advantages of this invention are further illustrated by the following examples, but the particular materials and amounts thereof recited in these examples, as well as other conditions and details, should not be construed to unduly limit this invention.

EXAMPLES

Several styrene-butadiene (SB) block copolymers were melt-blended with epoxy resins and triarylsulfonium hexfluoroantimonate ($Ar_3SSbF_6$) in a Brabender mixer. The $Ar_3SSbF_6$ was predissolved in the liquid epoxy resin or, in cases where no epoxy resin was added, the $Ar_3SSbF_6$ was dissolved in methyl ethyl ketone and added to the Brabender. The methyl ethyl ketone evaporated off during the mixing process. Conventional, epoxidized, and maleated SB block copolymers were evaluated. A summary of the SB-based thermoplastics is presented in Table I, below.

TABLE I

SB Block Copolymer Properties

| Tradename | wt. % Styrene | Butadiene Hydrogenated | Epoxy Equiv. Wt. | Anhydride Equiv. Wt. |
|---|---|---|---|---|
| Epofriend A1020 | 40 | No | 500 | — |
| Epofriend A1010 | 40 | No | 1000 | — |
| Epofriend A1005 | 40 | No | 2000 | — |
| Kraton D1101 | 31 | No | — | — |
| Kraton FG1901X | 30 | Yes | — | 5866 |
| Kraton FG1924X | 13 | Yes | — | 9806 |

Epofriend materials are SB block copolymers in which a certain amount of the unsaturation of the butadiene block has been epoxidized. These materials are sold by Daicel Chemical Industries, Ltd. Kraton FG1901X and FG1924X are SEBS (hydrogenated butadiene block) materials that have anhydride grafted to them. Kraton D1101 is a styrene-butadiene bock copolymer. These Kraton materials are sold by Shell Chemical Company.

Films (0.037 mm thick) were melt-pressed from the blends in a platen press having electrically-heated platens (F. Carver, Inc., Wabash, Ind.). The films were used to make 180 deg. T-peel samples, Tape Ball Grid Array (TBGA) samples and LMI samples for heat and moisture sensitivity evaluation. Thicker films (1.25–2.00 mm thick) were also pressed from the blends for Dynamic Mechanical Analysis (DMA).

Peel Strength to Kapton E

Peel specimens were prepared by placing the adhesive film onto 0.05 mm thick Kapton E polyimide film substrate, UV-irradiating the adhesive film at 2.2 milliwatt/cm$^2$ for 3 min. using a Sylvania 350BL bulb, placing another Kapton E substrate on top, and laminating at 210–220° C. and 690 kPa for 50 min. The resultant laminate was cut into 0.64 mm wide strips and evaluated for 180° T-peel at room temperature using an Instron instrument (Instron, Inc., Park Ridge, Ill.). The peel strengths are given in Tables II, III, and IV. Peel strengths for blends of the various SB block copolymers with Epon 828 (Shell Chemical) containing 2 wt. % Ar$_3$SSbF$_6$ based on the weight of Epon 828 are presented in Table II. Blends containing the epoxidized or maleated SB block copolymers had higher peel strengths than the conventional or non-functionalized SB (Kraton D1101). In the case of epoxidized SB, the material with the highest level of epoxidation, Epofriend A1020, afforded the greatest peel strengths. The peel strength was maximized at 5 wt. % Epon 828.

TABLE II

180 deg. T-peel Strengths of SB/Epon 828 Blends with 2 wt. % Ar$_3$SSbF$_6$ on Kapton E, Newtons/decimeter

| | Wt. % Epon 828 based on Total Wt. | | | | | | |
|---|---|---|---|---|---|---|---|
| Thermoplastic SB | 0 | 2.5 | 5.0 | 10 | 20 | 30 | 35 |
| Epofriend A1020 | 68.3 | 105 | 222 | 80.5 | 28.0 | 21.0 | 12.3 |
| Epofriend A1010 | | 75.3 | 45.5 | 5.3 | | | 5.3 |
| Epofriend A1005 | | | 66.5 | | | | 5.3 |
| Kraton D1101 | | 49.0 | 36.8 | | | | 24.5 |
| 92.5 Kraton D1101 /2.5 Epofriend A1020 | | | 17.0 | | | | |
| KratonFG1901X | | | 135 | | | | |
| KratonFG1924X | | | 201 | | | | |

Peel strengths for blends of Epofriend A1020 with ERL 4221 (Union Carbide) containing 2 wt. % Ar$_3$SSbF$_6$ based on the weight of ERL 4221 were also determined, and the results presented in Table III. The peel results were similar to those obtained with Epon 828.

TABLE III

180 deg. T-peel Strengths of Epofriend A1020/ERL 4221 with 2 wt. % Ar$_3$SSbF$_6$ Blends on Kapton E, N/dm

| | Wt. % ERL 4221 based on Total Wt. | | | | |
|---|---|---|---|---|---|
| Thermoplastic SB | 0 | 5 | 10 | 20 | 35 |
| Epofriend A1020 | 68.3 | 221 | 24.5 | 12.3 | 8.8 |

In the blends whose peel strengths are presented in Tables II and III, the concentration of epoxy catalyst, Ar$_3$SSbF$_6$, was a constant percent of the amount of epoxy resin. Thus, the concentration of Ar$_3$SSbF$_6$ based on the total amount of SB block copolymer plus epoxy resin actually decreased as the level of epoxy resin decreased. For example, the blend with 0 wt. % epoxy resin contained no Ar$_3$SSbF$_6$ and the blend with 2.5 wt. % epoxy resin contained half that of the blend with 5.0 wt. % epoxy resin. Several blends were made that contained 0.1 wt. % Ar$_3$SSbF$_6$ based on the total weight of SB block copolymer and epoxy resin (Epon 828). Their peel strengths to Kapton E are presented in Table IV.

TABLE IV

180 deg. T-peel Strengths of SB/Epon 828 Blends that contained 0.1 wt. % Ar$_3$SSbF$_6$ (based on total wt. of SB + Epon 828) on Kapton E, N/dm

| | Wt. % Epon 828 based on Total Wt. | | |
|---|---|---|---|
| Thermoplastic SB | 0 | 2.5 | 5.0 |
| Epofriend A1020 | 208 | 299 | 222 |
| Epofriend A1010 | 215 | 144 | 45.5 |
| Epofriend A1005 | 54.3 | 64.8 | 66.5 |
| Kraton D1101 | | 77.0 | |

In general, blends containing 100 to 95 wt. % of the epoxidized SB block copolymer and 0 to 5 wt. % epoxy resin provided the highest peel strengths. SB block copolymers with epoxy equivalent weights of 500 and 1000 (Epofriend A1020 and A1010) afforded the greater peel strengths. These peel strengths to Kapton E were excellent. For comparison, the peel strengths of Pyralux LF and Kapton KJ (commercially available elections adhesives from DuPont) to Kapton E were both approximately 70.0 N/dm.

A 95 wt. % Epofriend A1020/5 wt. % Epon 828 with 2 wt. % Ar$_3$SSbF$_6$ (based on Epon 828) film was UV-irradiated at 2.1 milliwatt/cm$^2$ for 10 min., and then used to make T-peel samples immediately, 1 week later, and 1 month later. The peel strengths to Kapton E were 194.3, 171.5, and 221 N/dm, respectively. This data indicates that the SB block copolymer/epoxy film can be UV irradiated at the time of its manufacture rather than just prior to its use in a lamination.

Shear Modulus

DMA was carried out on 1.25–2.0 mm thick adhesive films that were non-irradiated and UV-irradiated at 2.1 milliwatt/cm$^2$ for 10 min. just prior to DMA. The samples were heated from room temperature to 210° C. at 2° C./min and then held at 210° C. for 30 min to simulate thermal cure. After this hold, they were cooled rapidly back to 25° C. at 20° C./min, allowed to equilibrate for 5 min, and then heated to 250° C. at 2° C./min. In general, the films that were UV-irradiated provided higher shear modulus, G', at 220° C. (solder reflow temperature). The shear modulus vs. temperature plot of 95 wt. % Epofriend A1020/5 wt. % Epon 828 with 0.1 wt. % $Ar_3SSbF_6$ based on the total weight of Epofriend A1020+Epon 828 is shown in FIG. 1. The FIGURE shows the shear modulus of irradiated films was higher than that of non-irradiated films. In the FIGURE, trace A represents data from a film that was UV-irradiated, and trace B represents data from a film that was not UV-irradiated. In the case of the UV-irradiated sample, G' decreased with increasing temperature until 139° C., the onset temperature, at which point G' started to increase due to reaction of the epoxy groups. G' continued to increase throughout the 30 min. hold at 210° C. The difference in G' after the 30 min. hold compared to its value at the onset temperature is referred to as dG' in Table V. After the 30 min. hold, the sample temperature was dropped to 25° C., and then raised to 250° C. The increase in G' that developed on the first heating and hold was maintained in the second heating out to 250° C. Table V summarizes the DMA data for the UV-irradiated blends. The nomenclature for the compositions follows the format: wt. % SB thermoplastic/wt. % Epoxy resin (wt. % $Ar_3SSbF_6$). All wt. %'s were based on the total weight of SB thermoplastic+epoxy resin.

provided the greater degree of crosslinking. Increasing the concentration of Epon 828 to 10% and greater increased the shear modulus to a point; however, the peel strength began to decline.

Heat and Moisture Sensitivity Evaluation

Heat and moisture sensitivity was evaluated by following procedures similar to those of Joint Industry Standard, "Moisture/Reflow Sensitivity Classification for Plastic Integrated Circuit Surface Mount Devices", October 1996, J-STD-020, for JEDEC level 1 performance. Typical resin compositions to be evaluated comprised epoxidized styrene-butadiene block copolymer, optionally an epoxy resin, and $Ar_3SSbF_6$ curative. In addition, compositions comprising Epofriend A1020 and 0.25 or 11.1 wt. % 9,9'-bis(3-methyl-4-aminophenyl)fluorene (OTBAF, 3M, St. Paul, Minn.), an aromatic diamine curative, respectively, were blended in a Brabender mixer. Films of 0.037 mm thickness were melt-pressed from the blend at 180° C. Also, a blend of 60 wt % Epofriend A1020, 30 wt % polyphenylene oxide (PPO) HPP 820 (General Electric Plastics, Pittsfield, Mass.), and 10 wt % EPON 828, based on the total weight percent of all three components was prepared in toluene to form a 14 wt %

TABLE V

DMA Results for UV-Irradiated SB Thermoplastic/Epoxy Blends

| FORMULATION | Onset Temp. (° C.) | G', Onset Temp. $10^5$ Pa | G' after 210° C. Cure $10^5$ Pa | dG' $10^5$ Pa | G', 220° C. $10^5$ Pa |
|---|---|---|---|---|---|
| 95 Kraton D1101/5 Epon 828 (0.1) | 210 | 0.78 | 0.91 | 0.13 | 0.96 |
| 95 Kraton FG1924X/5 Epon 828 (0.1) | 210 | 1.36 | 1.30 | −0.06 | 1.37 |
| 100 Epofriend A1005 (0.1) | 210 | 1.14 | 1.14 | 0.00 | 1.20 |
| 95 Epofriend A1005/5 Epon 828 (0.1) | 210 | 1.10 | 1.11 | 0.01 | 1.15 |
| 100 Epofriend A1010 (0.1) | 176 | 3.50 | 3.60 | 0.10 | 3.69 |
| 97.5 Epofriend A1010/2.5 Epon 828 (0.05) | 152 | 1.02 | 1.09 | 0.07 | 1.10 |
| 97.5 Epofriend A1010/2.5 Epon 828 (0.1) | 149 | 2.18 | 2.35 | 0.17 | 2.43 |
| 95 Epofriend A1010/5.0 Epon 828 (0.1) | 156 | 1.84 | 2.06 | 0.22 | 2.22 |
| 100 Epofriend A1020 (0) | 210 | 1.07 | 1.17 | 0.10 | 1.25 |
| 100 Epofriend A1020 (0.1) | 137 | 1.97 | 3.51 | 1.54 | 3.67 |
| 97.5 Epofriend A1020/2.5 Epon 828 (0.05) | 146 | 1.16 | 1.79 | 0.63 | 1.92 |
| 97.5 Epofriend A1020/2.5 Epon 828 (0.1) | 128 | 5.39 | 7.94 | 2.55 | 8.16 |
| 95 Epofriend A1020/5 Epon 828 (0.1) | 139 | 1.41 | 2.83 | 1.42 | 3.06 |
| 90 Epofriend A1020/10 Epon 828 (0.2) | 123 | 3.77 | 7.94 | 4.17 | 7.86 |
| 80 Epofriend A1020/20 Epon 828 (0.4) | 102 | 3.04 | 7.08 | 4.04 | 6.30 |
| 95 Epofriend A1020/5 ERL 4221 (0.1) | 143 | 2.72 | 5.93 | 3.21 | 6.21 |
| 90 Epofriend A1020/10 ERL 4221 (0.2) | 119 | 9.68 | 21.6 | 11.9 | 21.4 |

For compositions of 100–95 wt. % SB block copolymer and 0–5 wt. % Epon 828, those containing non-functionalized SB (Kraton D1101) or lightly functionalized SB (Kraton FG1924X and Epofriend A1005) showed very little increase in shear modulus upon cure, dG'. Compositions containing Epofriend A1010, which is more highly functionalized, showed a slightly greater increase in shear modulus upon cure, and those containing Epofriend A1020, the most functionalized material, exhibited a much more pronounced increase in shear modulus. This is in accord with the fact that the more highly functionalized material solids, turbid solution. The solution further contained 0.075 wt % $Ar_3SSbF_6$, based on the total weight of the components thereof. The solution was knife coated onto poly(ethylene terephthalate) release liner, then air-dried for 24 hours, followed by further drying in an oven for 2 hours at 150° C. A 0.017 mm thick film was produced.

The lamination procedure followed for all the constructions (2-layer flex circuitry, TBGA, and LMI) was similar to that used for the T-peel samples, above, except in the case of the sample in which OTBAF was the curative. In that case, only thermal curing, at 231° C. for 30 minutes, was used (i.e., no UV-irradiation was used).

Heat and moisture sensitivity evaluations were conducted by drying the cured constructions at 125° C. for 24 hours, and then placing them in a humidity chamber at 85° C./85% R.H. for 168 hours. Within 15 minutes of removal from the humidity chamber, the constructions were passed through a Model GF-12 Infrared (IR) reflow oven (Automated Production Systems, Inc., Huntingdon Valley, Pa.) that heated the constructions from room temperature to 145° C. in approximately 70 seconds, held the constructions at 145° C. for approximately 90 seconds, then heated the constructions to a peak temperature of 220° C. Heating from 145° C. to 183° C. took 20 to 25 seconds. The constructions were exposed to temperatures above 183° C. for approximately 160 seconds, including 10 to 40 seconds at a peak temperature of 220° C. The constructions were visually observed as they passed through the reflow oven. Any blisters or voids that were observed constituted a failure. After the constructions passed out of the reflow oven, they were observed under an optical microscope for any voids, blisters, or other defects. If the construction was defect-free, it was sent through the reflow oven again. A construction was deemed to "pass" if no defects were observed after two cycles through the IR reflow oven.

Two-Layer Flex Circuitry

Heat and moisture sensitivity evaluation was performed on constructions having two layers of flex circuitry laminated together by means of a 0.037 mm thick film of the adhesive of the invention using $Ar_3SSbF_6$ curative. The flex circuitry was copper circuitry on a 0.025 mm thick Kapton E substrate. The construction was formed in such a way that the adhesive layer was in contact with the copper-trace side of one piece of flex circuitry and in contact with the polyimide (i.e., non-copper trace) side of the other piece of flex circuitry. The construction measured 5.0 cm×5.0 cm. Results are presented in Table VI.

TABLE VI

Heat and Moisture Sensitivity Results for 2 Layers of Flex Circuitry

| FORMULATION | RESULT |
|---|---|
| 95 Epofriend A1005/5 Epon 828 (0.1) | PASS |
| 95 Epofriend A1010/5 Epon 828 (0.1) | PASS |
| 95 Epofriend A1020/5 Epon 828 (0.1) | PASS |

TBGA Constructions

Heat and moisture sensitivity evaluation was performed on TBGA-like constructions composed of a layer of Kapton E film (0.05 mm thick) laminated with the SB thermoplastic/Epoxy Blend (0.037 mm thick film) to a metal (nickel-plated copper) stiffener. The construction was approximately 4.3 cm×4.3 cm square. The lamination procedure followed was similar to that used for the T-peel samples, except that the lamination pressure was 1749 KPa. Except as noted, the temperature profile of the TBGA constructions as they passed through the IR reflow oven was similar to that shown for the 2-layer flex circuitry constructions. Results are presented in Table VII:

TABLE VII

Heat and Moisture Sensitivity Results for TBGA

| FORMULATION* | RESULT |
|---|---|
| 100 Epofriend A1020 (0.1) | PASS |
| 100 Epofriend A1020 (0.25 OTBAF) | PASS |
| 100 Epofriend A1020 (11.1 OTBAF) | FAIL |
| 97.5 Kraton D1101/2.5 Epon 828 (0.05) | FAIL |
| 97.5 Kraton D1101/2.5 Epon 828 (0.1) | FAIL |
| 97.5 Epofriend A1010/2.5 Epon 828 (0.1) | FAIL |
| 97.5 Epofriend A1020/2.5 Epon 828 (0.05) | PASS |
| 97.5 Epofriend A1020/2.5 Epon 828 (0.1) | PASS |
| 95 Kraton D1101/5 Epon 828 (0.1) | FAIL |
| 95 Kraton FG1924X/5 Epon 828 (0.1) | FAIL |
| 95 Epofriend A1010/5 Epon 828 (0.1) | FAIL |
| 95 Epofriend A1020/5 Epon 828 (0.1) | PASS |
| 95 Epofriend A1020/5 Epon 1001F (0.1) | PASS |
| 90 Epofriend A1020/10 Epon 828 (0.2) | FAIL |
| 83.3 Epofriend A1020/16.7 ERL-4221 (0.33) | FAIL |
| 80 Epofriend A1020/20 Epon 828 (0.4) | FAIL |
| 70 Epofriend A1020/30 Epon 828 (0.6) | FAIL |
| 65 Epofriend A1020/35 Epon 828 (0.7) | FAIL |
| 60 Epofriend A1020/30 HPP 820/10 Epon 828 (0.075) | PASS |

*$Ar_3SSbF_6$ curative unless otherwise noted

The data of Table VII show that blends comprising 100–95 wt. % Epofriend A1020 and 0–5 wt. % epoxy resin provided constructions having superior heat and moisture insensitivity similar to that required to pass JEDEC level 1. All formulations noted in Table VII that failed were observed to fail in the first cycle through the IR reflow oven. All formulations that passed the first cycle also passed the second cycle.

A TBGA construction with an adhesive film of 95 Epofriend A1020/5 Epon 828 (0.1) underwent an identical evaluation to that described above, except the peak temperature of the construction on passage through the IR reflow oven was increased to 240° C. This is a more demanding heating profile than that required for JEDEC level 1 performance. The construction passed this evaluation.

In addition to the results obained on Kapton E alone (substrate for flex circuitry), performance of adhesive formulations of the invention was observed on 0.025 mm thick Kapton E film on which copper circuitry was deposited. The size of the TBGA construction and metal stiffener were the same as used previously. A TBGA construction with an adhesive film of 97.5 Epofriend A1020/2.5 ERL 4221 (0.05) underwent an identical evaluation to that described for the constructions in Table VII (peak temperature of 220° C.), except this construction was cycled through the IR reflow oven a total of three times. The construction passed this evaluation. Another TBGA construction with a 0.062 mm thick adhesive film of 97.5 Epofriend A1020/2.5 Epon 828 (0.1) underwent an identical evaluation, except the peak temperature of the construction on cycling through the IR reflow oven was increased to 240° C. This construction was cycled through the IR reflow oven three times. The construction passed this evaluation. The adhesive film in this latter case was melt-blended in a 25 mm Berstorff twin-screw extruder (Berstorff Corp., Charlotte, N.C.) rather than a Brabender mixer.

More TBGA constructions were evaluated in which performance of adhesive formulations of the invention was observed on 0.025 mm thick Kapton E film on which gold-plated copper circuitry was deposited. The metal stiffener was nickel-plated copper, 0.5 mm thick and 29 mm×29 mm square with a 13 mm×13 mm square hole punched through the center. Films of 95 Epofriend A1020/5 Epon 828 (0.1) were UV-radiated at 2 mW/cm$^2$ for 3 minutes and then laminated between the flex circuitry and metal stiffener for 50 minutes at 215° C. and 690 KPa. The laminated packages were baked for 24 hours minimum at 125° C. and then placed in an 85° C./85% RH oven for 168 hours.

After removal from the oven, the packages sat at room temperature for at least 15 minutes and no longer than 4 hours. Two methods were used to check moisture sensitivity: (1) hot plate and (2) convection oven:

The hot plate was heated to 220° C. The package was placed stiffener side down for 1 minute and was immediately heated to 220° C. The sample was observed through a magnifying camera for delamination or cracking. Any samples that did not delaminate or crack were later double-checked in a microscope to confirm that less than 10% voiding occurred. If it had not, the package "passed". It is to be noted that the hot plate method had a more severe ramp rate than JEDEC Test Method A112-A, which required a temperature ramp of 6° C./second maximum and 220° C. for 10–40 seconds. Thus, heating with a hot plate was a more severe test than that required by the JEDEC standard. For samples of the present invention, 5 out 5 packages passed this hot plate protocol.

The convection oven was a Unitherm SMR 400 (Vitronics Corp., Newmarket, N.H.). A thermocouple placed on the package indicated that heat was increased at a rate of about 3° C./second, reaching a maximum of 220° C. and staying at 220° C. and above for about 40 seconds. The samples were observed in a microscope to confirm less than 10% voiding. For samples of the present invention, 4 out 4 packages passed this convection oven protocol.

LMI Constructions

LMI constructions also underwent heat and moisture sensitivity evaluations. The LMI construction consisted of 5 layers of flex circuitry (copper traces on Kapton E film) that were laminated together with 4 layers of adhesive; alternating layers of flex circuitry and adhesive. The circuitry on each layer of flex was arranged into nine 3.2 cm×3.2 cm square regions that were laid out in a 3×3 grid. Upon lamination, nine coupons 3.2 cm×3.2 cm, which contained 5 layers of flex and 4 layers of adhesive, were formed. Laminations conditions were the same as those described for the T-peel samples, above. The temperature profile of the LMI constructions as they passed through the IR reflow oven was similar to that of the 2-layer flex circuitry construction described above. The LMI construction was deemed to "pass" if no defects were observed after two cycles through the IR reflow oven. Results of the evaluation are shown in Table VII below:

TABLE VIII

Heat and Moisture Sensitivity Results for LMI

| FORMULATION | RESULT |
|---|---|
| 95 Kraton D1101/5 Epon 828 (0.1) | 0 out of 9 coupons PASS |
| 95 Epofriend A1020/5 Epon 828 (0.1) | 7 out of 9 coupons PASS |

Temperature Humidity Bias (THB) Evaluation

Kapton E film (0.005 cm thick) was laminated to a Kapton E film having flex circuitry that was an interdigitated copper test circuit by the use of 95 Epofriend A1020/5 Epon 828 (0.1) adhesive film. The adhesive filled the space between the interdigitated copper traces. The copper traces were approximately 70 micrometers wide with 80 micrometer spaces between them. The test circuit was placed in 85° C./85% R.H. and a 5 volt bias was placed on the test circuit. The leakage current was monitored in order to determine any deterioration in performance. Two such test circuits were evaluated, and both logged over 1000 hours without any deterioration in their performance and exhibited very low leakage current.

Various modifications and alterations of this invention will become apparent to those skilled in the art without departing from the scope and intent of this invention, and it should be understood that this invention is not to be unduly limited to the illustrative embodiments set forth herein.

What is claimed is:

1. An electronic circuit device comprising a resin composition including 90 to 100 weight percent of a curable epoxy-modified aromatic vinyl-conjugated diene block copolymer, zero and up to 10 weight percent of an epoxy resin, and an effective amount of an epoxy curative, the weight percent of the copolymer and epoxy resin being based on the weight of the epoxy bearing material exclusive of curative.

2. The electronic circuit device according to claim 1 wherein said resin composition is an adhesive.

3. The electronic circuit device according to claim 1 wherein said resin composition is a covercoating.

4. The electronic circuit device according to claim 1 wherein said resin composition is an encapsulant.

5. The electronic circuit device according to claim 1 which comprises an electronic package.

6. The electronic circuit device according to claim 1 wherein said resin composition is adhered to a substrate.

7. The electronic circuit device according to claim 6 wherein said substrate is a polyimide film.

8. The electronic circuit device according to claim 7 wherein said substrate further comprises electronic circuitry.

9. The electronic circuit device according to claim 6 wherein said substrate comprises flexible circuitry.

10. The electronic circuit device according to claim 1 wherein said epoxy resin comprises an aliphatic or alicyclic epoxy.

11. The electronic circuit device according to claim 1 wherein said epoxy resin comprises an aromatic epoxy.

12. The electronic circuit device according to claim 10 wherein said alicyclic epoxy is selected from the group consisting of cyclohexene dioxide, 3,4-epoxycyclohexylmethyl-3,4-epoxycyclohexane carboxylate, 3,4-epoxy-6-methylcyclohexylmethyl-3,4-epoxy-6-methylcyclohexane carboxylate, bis(3,4-epoxy-6-methylcyclohexylmethyl)adipate, dipentene dioxide, 2-(3,4-epoxycyclohexyl)-5,1"-spiro-3",4"-epoxycyclohexane-1,3-dioxane, 4-(1,2-epoxyethyl)-1,2-epoxycyclohexane, and 2,2-bis(3,4-epoxycyclohexyl)propane.

13. The electronic circuit device according to claim 11 wherein said aromatic epoxy is selected from the group consisting of polyglycidyl ethers of polyhydric phenols and their derivatives, epoxy cresol-novolac resins, epoxy phenol-novolac resins; and glycidyl esters of aromatic carboxylic acids, and mixtures thereof.

14. The electronic circuit device according to claim 1 wherein said epoxy-modified aromatic vinyl-conjugated diene block copolymer is elected from the group consisting of epoxidized styrene-butadiene block copolymers and epoxidized, partially hydrogenated styrene-butadiene block copolymers.

15. The electronic circuit device according to claim 1 wherein said epoxy-modified aromatic vinyl-conjugated diene block copolymer is selected from the group consisting of epoxidized styrene-isoprene block copolymers and epoxidized, partially hydrogenated styrene-isoprene block copolymers.

16. The electronic circuit device according to claim 1 wherein said curative is selected from UV photocatalysts and thermal curing agents.

17. The electronic circuit device according to claim 1 wherein said curative is a triaryl sulfonium salt.

18. The electronic circuit device according to claim 1 wherein said curative is present in an amount in the range of 0.01 to 5.00 weight percent based on the total weight of the epoxy-bearing material.

19. The electronic circuit device according to claim 1 wherein said epoxy-modified aromatic vinyl-conjugated diene block copolymer has an epoxy equivalent weight in the range of 100 to 1000.

20. The electronic circuit device according to claim 1 wherein said 90 to 100 weight percent of a curable epoxy-modified aromatic vinyl-conjugated diene block copolymer includes a polyphenylene ether resin in an amount of up to 80 parts of said polyphenylene ether per 100 parts of said curable epoxy-modified aromatic vinyl-conjugated diene block copolymer.

21. The electronic circuit device according to claim 1 wherein said resin composition further comprises additives selected from the group consisting of thixotropic agents, pigments, fillers, reinforcing materials.

22. The electronic circuit device according to claim 1 wherein said resin composition further comprises a tackifier.

23. The electronic circuit device according to claim 1 wherein said resin composition further comprises a chain extender.

24. The electronic circuit device according to claim 21 wherein said filler is selected from the group consisting of conductive fillers, fibers, fumed silica, clays, and glass beads and bubbles.

25. The electronic circuit device according to claim 1 wherein the resin composition comprising epoxy-modified aromatic vinyl-conjugated diene block copolymer and optional epoxy resin has been cured by one or both of UV radiation and heat.

26. The electronic circuit device according to claim 7 wherein the resin composition comprising epoxy-modified aromatic vinyl-conjugated diene block copolymer and optional epoxy resin is cured by one or both of UV radiation and heat.

27. The electronic circuit device according to claim 25 wherein said device exhibits stability towards conditions of 85° C. and 85% relative humidity for 168 hours followed by a temperature of 220° C. for 10 to 40 seconds.

28. The electronic circuit device according to claim 26 wherein said device exhibits stability towards conditions of 85° C. and 85% relative humidity for 168 hours followed by a temperature of 220° C. for 10 to 40 seconds.

29. A method of using an electronic adhesive, covercoat, or encapsulant comprising the steps of:
providing a curable resin composition including 90 to 100 weight percent of an epoxy-modified aromatic vinyl-conjugated diene block copolymer, optionally an epoxy resin, and an epoxy curative, the weight percent of the copolymer and epoxy resin being based on the weight of epoxy-bearing material exclusive of curative, and incorporating said resin composition as an adhesive, covercoat, or encapsulant into an article.

30. The method according to claim 29 further comprising the step of subjecting said curable resin composition to one or both of thermal and UV radiating curing.

31. The method according to claim 29 wherein said article is an electronic circuit device.

32. The method according to claim 30 wherein said article exhibits stability towards conditions of 85° C. and 85% relative humidity for 168 hours followed by a temperature of 220° C. for 10 to 40 seconds.

33. The electronic circuit device according to claim 1 wherein said curable epoxy-modified aromatic vinyl-conjugated diene block copolymer has an epoxy equivalent weight of 500.

34. The electronic circuit device according to claim 1 wherein said weight percent of an epoxy resin is 2.5 and up to 10.

35. The electronic circuit device according to claim 34 wherein said curable epoxy-modified aromatic vinyl-conjugated diene block copolymer has an epoxy equivalent weight in the range of 100 to 1000.

36. The electronic circuit device according to claim 34 wherein said curable epoxy-modified aromatic vinyl-conjugated diene block copolymer has an epoxy equivalent weight of 500.

37. A resin composition including 90 to 100 weight percent of a curable epoxy-modified aromatic vinyl-conjugated diene block copolymer, 2.5 and up to 10 weight percent of an epoxy resin, and an effective amount of an epoxy curative, the weight percent of the copolymer and epoxy resin being based on the weight of the epoxy bearing material exclusive of curative.

38. The resin composition according to claim 37 wherein said curable epoxy-modified aromatic vinyl-conjugated diene block copolymer has an epoxy equivalent weight in the range of 100 to 1000.

39. The resin composition according to claim 37 wherein said curable epoxy-modified aromatic vinyl-conjugated diene block copolymer has an epoxy equivalent weight of 500.

40. A resin composition including 90 to 100 weight percent of a curable epoxy-modified aromatic vinyl-conjugated diene block copolymer, zero and up to 10 weight percent of an epoxy resin, and an effective amount of an epoxy curative, the weight percent of the copolymer and epoxy resin being based on the weight of the epoxy bearing material exclusive of curative, wherein said curable epoxy-modified aromatic vinyl-conjugated diene block copolymer has an epoxy equivalent weight in the range of 100 to 1000.

41. The resin composition according to claim 40 wherein said curable epoxy-modified aromatic vinyl-conjugated diene block copolymer has an epoxy equivalent weight of 500.

42. The electronic circuit device according to claim 1 wherein said curable epoxy-modified aromatic vinyl-conjugated diene block copolymer comprises a homopolymer block derived from polymerization of an aromatic vinyl moiety.

43. The resin composition according to claim 37 wherein said curable epoxy-modified aromatic vinyl-conjugated diene block copolymer comprises a homopolymer block derived from polymerization of an aromatic vinyl moiety.

44. The resin composition according to claim 40 wherein said curable epoxy-modified aromatic vinyl-conjugated diene block copolymer comprises a homopolymer block derived from polymerization of an aromatic vinyl moiety.

* * * * *

UNITED STATES PATENT AND TRADEMARK OFFICE
CERTIFICATE OF CORRECTION

PATENT NO.    : 6,294,270 B1
DATED         : September 25, 2001
INVENTOR(S)   : Clough, Robert S.

It is certified that error appears in the above-identified patent and that said Letters Patent is hereby corrected as shown below:

Column 2,
Line 26, "S" should read -- 5 --.

Column 5,
Line 41, "(Mw/Mn)" should read -- $(M_w/M_n)$ --.
Line 42, "(Mw)" should read -- $(M_w)$ --.
Line 43, "(Mn)" should read -- $(M_n)$ --.

Column 19,
Lines 3 and 5, "FIGURE" should read -- Figure --.

Signed and Sealed this

Tenth Day of June, 2003

JAMES E. ROGAN
*Director of the United States Patent and Trademark Office*